United States Patent
Lung et al.

(10) Patent No.: US 8,179,181 B2
(45) Date of Patent: May 15, 2012

(54) POWER-MODE-AWARE CLOCK TREE AND SYNTHESIS METHOD THEREOF

(75) Inventors: Chiao-Ling Lung, Hsinchu County (TW); Shih-Chieh Chang, Hsinchu (TW)

(73) Assignees: Industrial Technology Research Institute, Hsinchu (TW); National Tsing Hua University, Hsinchu (TW)

( * ) Notice: Subject to any disclaimer, the term of this patent is extended or adjusted under 35 U.S.C. 154(b) by 142 days.

(21) Appl. No.: 12/750,721

(22) Filed: Mar. 31, 2010

(65) Prior Publication Data
US 2011/0121875 A1    May 26, 2011

(30) Foreign Application Priority Data
Nov. 20, 2009  (TW) .................................. 98139560 A

(51) Int. Cl.
*H03H 11/26* (2006.01)
(52) U.S. Cl. ........ 327/276; 327/291; 327/156; 365/225; 365/226
(58) Field of Classification Search .................. 327/149, 327/156, 276, 291; 365/226, 227
See application file for complete search history.

(56) References Cited

U.S. PATENT DOCUMENTS

| | | | | |
|---|---|---|---|---|
| 6,930,949 B2 * | 8/2005 | Schaefer | ................... | 365/227 |
| 6,937,530 B2 * | 8/2005 | Bell | ................... | 365/189.02 |
| 6,967,893 B2 * | 11/2005 | Heyne | ................... | 365/94 |
| 7,277,333 B2 * | 10/2007 | Schaefer | ................... | 365/194 |
| 7,843,745 B2 * | 11/2010 | Choi | ................... | 365/194 |
| 2007/0002663 A1 * | 1/2007 | Schaefer | ................... | 365/226 |
| 2009/0121757 A1 * | 5/2009 | Kim et al. | ................... | 327/149 |
| 2010/0246299 A1 * | 9/2010 | Iwai et al. | ................... | 365/200 |

OTHER PUBLICATIONS

Lung et al., "Clock Skew Optimization Considering Complicated Power Modes," 2010 EDAA.
Jens Sparsø, "Asynchronous Circuit Design-A Tutorial," http://www.ee.technion.ac.il/courses/048878/book.pdf, 2006.
Roy H. Liu, "How to Create Designs with Dynamic/Adaptive Voltage Scaling," ARM Developers Conference, 2004.
P. Mahoney et al., "Clock Distribution on a Dual-Core, Multi-Threaded Itanium-Family Processor," ISSCC, 2005.

* cited by examiner

*Primary Examiner* — Ryan Jager
(74) *Attorney, Agent, or Firm* — Jianq Chyun IP Office

(57) ABSTRACT

A power-mode-aware (PMA) clock tree and a synthesis method thereof are provided. The clock tree includes a sub clock tree and a PMA buffer. The sub clock tree transmits a delayed clock signal to a function module, wherein a power mode of the function module is determined according to a power information. The PMA buffer is coupled to the sub clock tree. The PMA buffer determines the delay time of a system clock signal according to the power information delays the system clock signal, and outputs the delayed system clock signal to the sub clock tree as the delayed clock signal.

10 Claims, 5 Drawing Sheets

POWER-MODE-AWARE CLOCK TREE AND SYNTHESIS METHOD THEREOF

CROSS-REFERENCE TO RELATED APPLICATION

This application claims the priority benefit of Taiwan application serial no. 98139560, filed on Nov. 20, 2009. The entirety of the above-mentioned patent application is hereby incorporated by reference herein and made a part of specification.

BACKGROUND OF THE INVENTION

1. Technical Field

The disclosure generally relates to a power-mode-aware clock tree and a synthesis method thereof.

2. Background

Integrated circuits (IC) with different power modes have been broadly adopted in order to reduce power consumption. FIG. 1 is a diagram of a clock tree (or a clock network) in a conventional IC. Referring to FIG. 1, the same IC (or chip) may be divided into different function modules, such as the micro-processor unit (MPU) 110 and the digital signal processor (DSP) 120. In a full speed power mode, both the MPU 110 and the DSP 120 operate under their maximum operating voltages (for example, 1.1V) under the control of a control circuit inside (or outside) the IC. In a power mode of a particular operation condition, the operating voltage $V_{MPU}$ of the MPU 110 remains at 1.1V, while the operating voltage $V_{DSP}$ of the DSP 120 is turned down (for example, to 1.0V) to reduce electricity consumption. In a power mode of another particular operation condition, the operating voltage $V_{MPU}$ of the MPU 110 remains at 1.1V, while the operating voltage $V_{DSP}$ of the DSP 120 is turned down to a even lower voltage (for example, 0.9V). In an idle mode, the operating voltage $V_{MPU}$ of the MPU 110 is turned down to 0.9V and the operating voltage $V_{DSP}$ of the DSP 120 is turned down to 0 V so that less electricity is consumed.

A clock tree can be automatically synthesized by using an electronic design automation (EDA) software at circuit synthesis. A clock tree is usually composed of a plurality of buffers (such as the buffers 101-107 illustrated in FIG. 1) for enhancing a system clock signal CLK and transmitting the enhanced system clock signal CLK to the next buffer or other devices. The system clock signal CLK can be sent to every element (not shown) in the IC through the clock tree. Ideally, the system clock signal CLK simultaneously reaches every element through the clock tree. Generally speaking, different factors (for example, the transmission paths and loads) may cause the system clock signal CLK to reach the elements in the IC at different time, and the difference between the time that the system clock signal CLK reaches different elements is called clock skew.

The EDA software can individually adjust the delay time of the buffers 101-107 regarding a particular operation condition, so as to optimize (minimize) the clock skew. For example, the EDA software can adjust the delay time of the buffers 101-107 regarding the full speed power mode so as to optimize the clock skew. However, because the operating voltage affects the performance of a clock buffer significantly, the time for the clock signal to reach every element changes obviously in different power mode. When the operating voltage $V_{DSP}$ of the DSP 120 is turned down from 1.1 V to 0.9 V, the clock delay of the DSP 120 increases, and the clock skew increases correspondingly. Thus, the clock tree illustrated in FIG. 1 cannot satisfy the clock skew restrictions in all the possible power modes.

Generally speaking, clock synchronization in a multi-power-mode design can be achieved through the asynchronous design, the adoption of an adjustable delay buffer (ADB), or the adoption of a delay locked loop (DLL). If the asynchronous design is adopted, a handshake protocol needs to be set up and accordingly the difficulty in designing and verifying the system is increased. Besides, any additional synchronization circuit needs to be disposed for synchronizing data. If the ADB or DLL is adopted, clock signals need to be sent back from a plurality of ends of the clock tree to perform phase comparison. Accordingly, additional ADB or DLL circuit design and disposition are required and the area cost is increased. Besides, the ADB or DLL requires an additional reference clock, and the selection of the reference clock may affect the synchronization effect.

SUMMARY

According to an embodiment of the disclosure, a clock tree including a sub clock tree and a power-mode-aware (PMA) buffer is provided. The sub clock tree transmits a delayed clock signal to a function module, wherein a power mode of the function module is determined according to a power information. The PMA buffer is coupled to the sub clock tree. The PMA buffer determines a delay time of a system clock signal according to the power information, delays the system clock signal, and outputs the delayed system clock signal to the sub clock tree as the delayed clock signal.

According to an embodiment of the disclosure, a clock tree synthesis method including following steps is provided. A sub clock tree is configured in a function module to transmit a delayed clock signal, wherein a power mode of the function module is determined according to a power information. A PMA buffer is disposed to supply the delayed clock signal to the sub clock tree. The PMA buffer determines a delay time of a system clock signal according to the power information, delays the system clock signal, and outputs the delayed system clock signal to the sub clock tree as the delayed clock signal.

As described above, a clock tree and a synthesis method thereof are provided in exemplary embodiments of the disclosure, wherein a PMA buffer generates a clock delay corresponding to each different power mode. Thereby, the exemplary embodiments of clock tree in the disclosure can satisfy the clock skew restrictions in different power modes.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
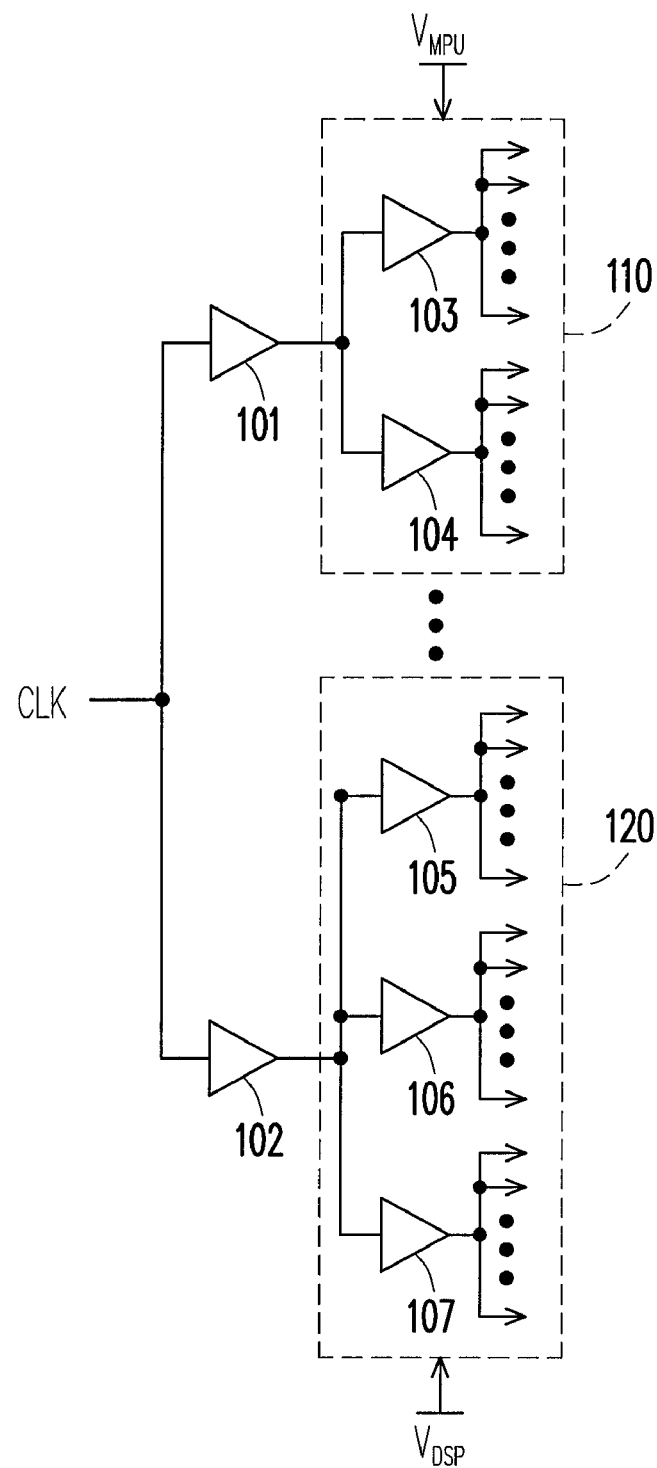
FIG. 1 is a diagram of a clock tree (or a clock network) in a conventional integrated circuit (IC).

Reference will now be made in detail to the exemplary embodiments of the disclosure, examples of which are illustrated in the accompanying drawings. Wherever possible, the same reference numbers are used in the drawings and the description to refer to the same or like parts.

In embodiments of the disclosure, a clock network (or clock tree) is provided to achieve a balance between the issues of clock skew and area cost. In following embodiments, each integrated circuit (IC) is divided into two levels: a chip level and a module level. In every different power mode, the clock tree optimization at the chip level reduces clock skew between modules, while the clock tree optimization at the module level reduces clock skew within a single module.

Figure 2:
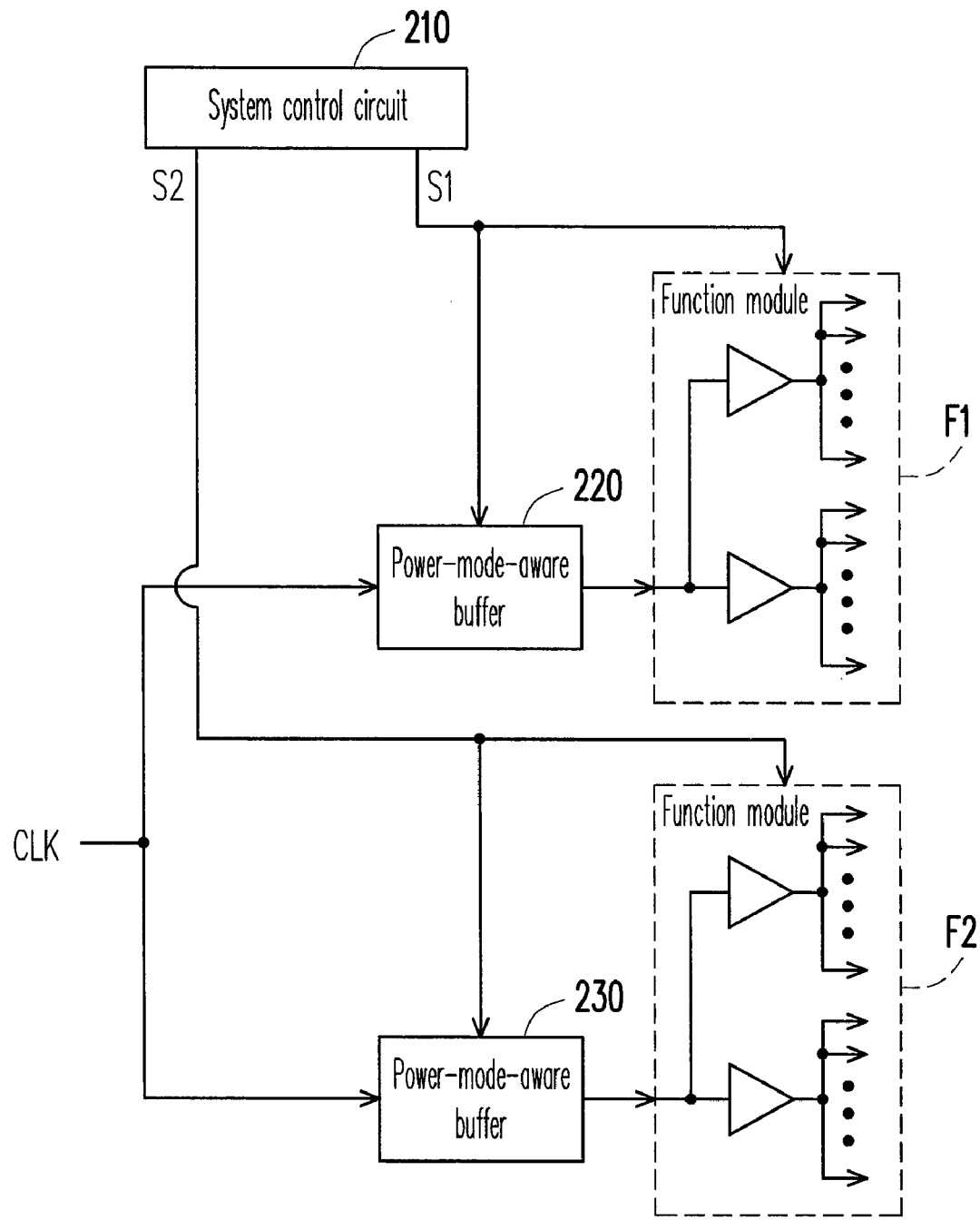
FIG. 2 is a diagram of a clock tree in an IC according to an exemplary embodiment.

FIG. 2 is a diagram of a clock tree in an IC according to an embodiment of the disclosure. The IC has a first function module F1 and a second function module F2. The function modules F1 and F2 may be microprocessors, microcontrollers, digital signal processors (DSPs), memories, and/or communication circuits, etc. For example, the first function module F1 may be the micro-processor unit (MPU) 110 in FIG. 1, and the second function module F2 may be the DSP 120 in FIG. 1. It should be noted that even though only two function modules are illustrated in FIG. 2, more function modules may be disposed according to the description of FIG. 2. A system control circuit 210 inside (or outside) the IC can change the power modes of the function modules F1 and F2 according to the power information S1 and the power information S2. The first function module F1 determines its power mode (for example, operates under an operating voltage of 1.1V or 0.9V) according to the power information S1. The second function module F2 determines its power mode (for example, operates under 1.1V, 1.0 V, 0.9V, or 0 V) according to the power information S2.

The clock tree illustrated in FIG. 2 includes two sub clock trees and two power-mode-aware (PMA) buffers 220 and 230. An electronic design automation (EDA) software can automatically configure the corresponding sub clock trees in the function modules F1 and F2 at circuit synthesis. The EDA software can individually adjust the delay time of each buffer in a sub clock tree regarding a particular power mode (for example, under a full speed operation condition) so that the clock skew of the sub clock tree can be optimized (minimized) at the module level.

Figure 3A:
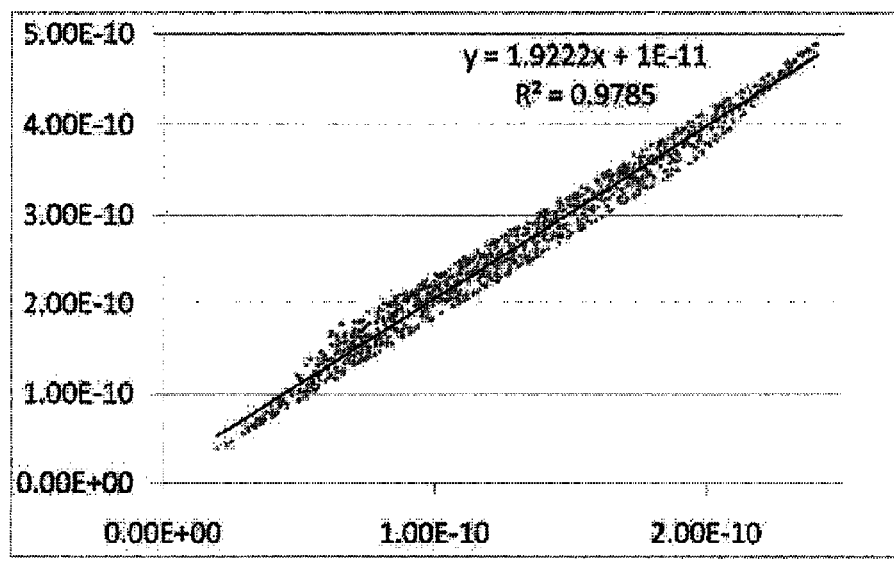
FIG. 3A and FIG. 3B respectively illustrate the delay effects of two buffers with different driving capabilities in a 65 nm process under different operating voltages.
Figure 3B:
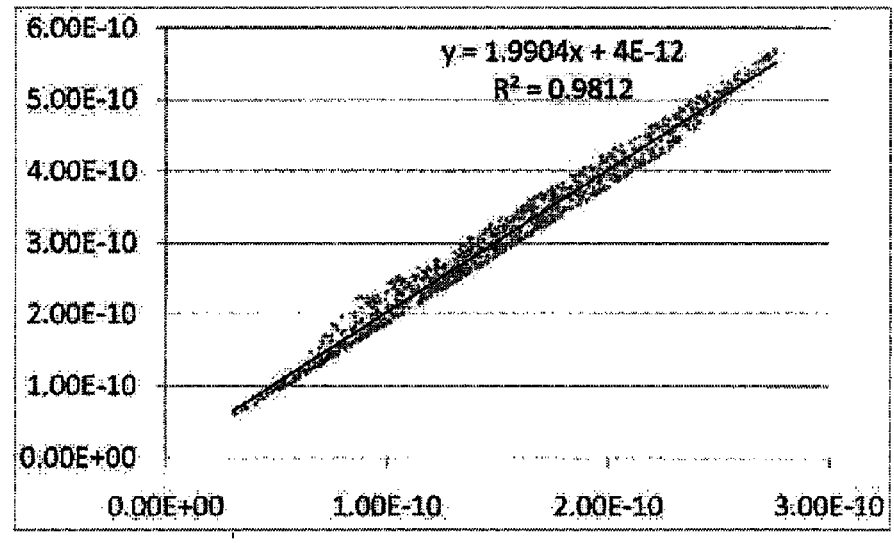

FIG. 3A and FIG. 3B respectively illustrate the delay effects of two buffers with different driving capabilities in a 65 nm process under different operating voltages. In FIG. 3A (or FIG. 3B), the ordinate indicates the delay time of a buffer in different operation environments (for example, different input signal intensities and different loads) when the operating voltage is a particular reference voltage, and the abscissa indicates the delay time of the buffer in different operation environments when the operating voltage is another predetermined voltage. The delay time of a buffer under different operating voltages (a particular reference voltage and another predetermined voltage) are obtained by simulating the buffer in a specific operation environment with the assistance of a simulation tool (for example, SPICE), and the corresponding points are then marked in FIG. 3A (or FIG. 3B) according to the delay time. Next, the same buffer is repeatedly simulated in other operation environments with the assistance of the simulation tool, so as to obtain the delay time of the buffer under different operating voltages, and the corresponding points are then marked in FIG. 3A (or FIG. 3B).

For example, it can be understood from FIG. 3A (or FIG. 3B) that the delay time of a buffer under different operating voltages has a linear presentation. Thus, a delay correlation factor (DCF) which indicates the delay correlation of the buffer under different operating voltages can be obtained according to the distribution of the points in FIG. 3A (or FIG. 3B). For example, a delay time T1 of the buffer when the operating voltage is a first voltage V1 is obtained through simulation/optimization. Because the DCF when the operating voltage is the first voltage V1 and a second voltage V2 is a based on the analysis described above, the delay time T2 of the buffer is about α×T1 when the buffer operates under the second voltage V2. Regarding the sub clock tree optimization at the module level, the DCF is adopted to reduce the clock skew caused by process variation within a single module.

While synthesizing the clock tree, the PMA buffers 220 and 230 are disposed in the IC, and corresponding sub clock trees are respectively configured in the function modules F1 and F2, as shown in FIG. FIG. 2. The PMA buffers 220 and 230 determine the delay time of the system clock signal CLK according to the power information S1 and S2, delay the system clock signal CLK to generate a delayed clock signal, and transmit the delayed clock signal to the sub clock trees of the function modules F1 and F2. The sub clock trees in the function modules F1 and F2 transmit the delayed clock signal to different elements (not shown) in the function modules F1 and F2.

When the power modes set according to the power information S1 and S2 indicate that the function modules F1 and F2 both operate under the first voltage V1 (for example, 1.1 V), the clock delay of the clock tree is optimized to determine the delay time of the PMA buffers 220 and 230 corresponding to the first voltage V1. For example, after optimizing the clock delay of the clock tree operating under the first voltage V1, the delay time of the PMA buffer 220 is 20 ps, and the delay time of the PMA buffer 230 is 400 ps.

In the present embodiment, clock skew in multiple power modes is reduced by using the PMA buffers 220 and 230 regarding the clock tree optimization at the chip level. The PMA buffers 220 and 230 generate clock delays corresponding to different power modes according to these power modes. For example, if the power information S1 and S2 indicates that the present power mode is a full speed mode (i.e., the function modules F1 and F2 both operate under the maximum voltage (for example, 1.1 V), the PMA buffers 220 and 230 respectively determine the delay time thereof to be 20 ps and 400 ps according to the power information S1 and S2. If the power information S1 and S2 indicates that the present power mode makes the function module F1 to operate under the maximum voltage (for example, 1.1V) and the operating voltage of the function module F2 to be reduced (for example, to 0.9V), the delay time of the sub clock tree in the function module F2 prolonged due to the lower operating voltage. The PMA buffers 220 and 230 respectively determine the delay time thereof to be 20 ps and 350 ps according to the power information S1 and S2. When the function module F2 turns down its operating voltage, the PMA buffer 230 correspondingly reduces its delay time so that the clock skew of the entire clock tree can still meet the design specification.

Figure 4:
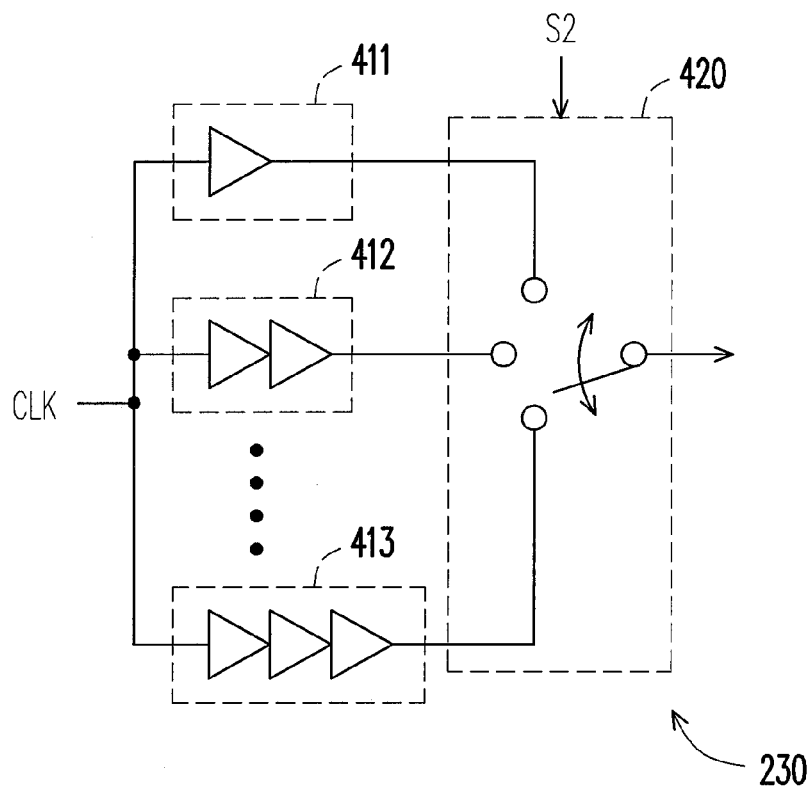
FIG. 4 illustrates an example of a power-mode-aware (PMA) buffer in FIG. 2 according to an exemplary embodiment.

FIG. 4 illustrates an example of the PMA buffer 230 in FIG. 2 according to an embodiment of the disclosure. The PMA buffer 220 can be implemented by referring to the PMA buffer 230. Referring to FIG. 4, the PMA buffer 230 includes a plurality of delay channels (for example, the delay channels 411, 412, and 413 illustrated in FIG. 4) and a switch unit 420. The delay channels 411, 412, and 413 respectively have a different delay time, wherein the input terminals of the delay channels receive the system clock signal CLK. The delay channels 411, 412, and 413 can be implemented through any technique. For example, the delay channels 411, 412, and/or 413 may be implemented by using one or multiple buffers. The delay time of the delay channels 411, 412, and 413 can be respectively determined by adjusting the sizes of the buffers or by determining the number of buffers that are connected in series. The number of the delay channels is corresponding to the number of the power modes.

The switch unit 420 is coupled between the delay channels and the sub clock tree of the function module F2. The switch unit 420 electrically connects the output terminal of one of the delay channels to the sub clock tree of the function module F2 according to the power information S2. Thus, the PMA buffer 230 can generate a clock delay corresponding to different power mode.

In some embodiments, the power information S1 and S2 may be power mode control signals (digital logic signals). The function modules F1 and F2 correspondingly change the operating voltages thereof according to the power mode control signals output by the system control circuit 210. For example, if the power information S2 is logic 1, the operating voltage in the function module F2 is pulled up to its maximum level, so that a full speed operation can be carried out. If the power information S2 is logic 0, the operating voltage in the function module F2 is turned down to a lower level so that less electricity is consumed.

Figure 5:
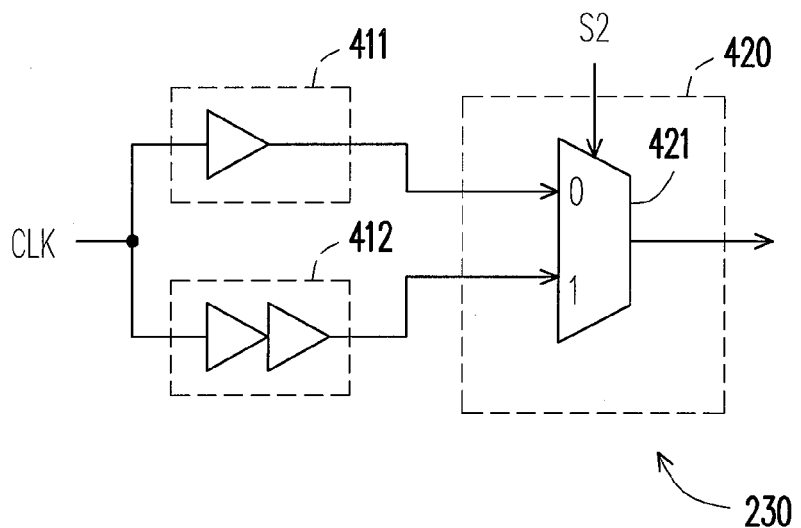
FIG. 5 illustrates another example of the PMA buffer in FIG. 4 according to an exemplary embodiment.

FIG. 5 illustrates another example of the PMA buffer in FIG. 4 according to an embodiment of the disclosure. It is assumed herein that the IC has only two power modes and accordingly two delay channels 411 and 412 are disposed in the PMA buffer 230. In the present embodiment, the power information S2 is a power mode control signal (a digital logic signal). Thus, the switch unit 420 is implemented by using a multiplexer 421. If the power information S2 is logic 1, the multiplexer 421 electrically connects the output terminal of the delay channel 412 to the sub clock tree of the function module F2. If the power information S2 is logic 0, the multiplexer 421 electrically connects the output terminal of the delay channel 411 to the sub clock tree of the function module F2.

In some other embodiments, the power information S1 and S2 may be operating voltages. The system control circuit 210 outputs the operating voltages to supply operating electricity to the function modules F1 and F2. Thus, the system control circuit 210 can determine the power modes of the function modules F1 and F2 by adjusting the operating voltages S1 and/or S2. For example, the system control circuit 210 can adjust the operating voltage S2 to the maximum level so that the function module F2 can perform a full speed operation, and the system control circuit 210 can also adjust the operating voltage S2 to a lower level so that the function module F2 can perform a power-saving operation.

Figure 6:
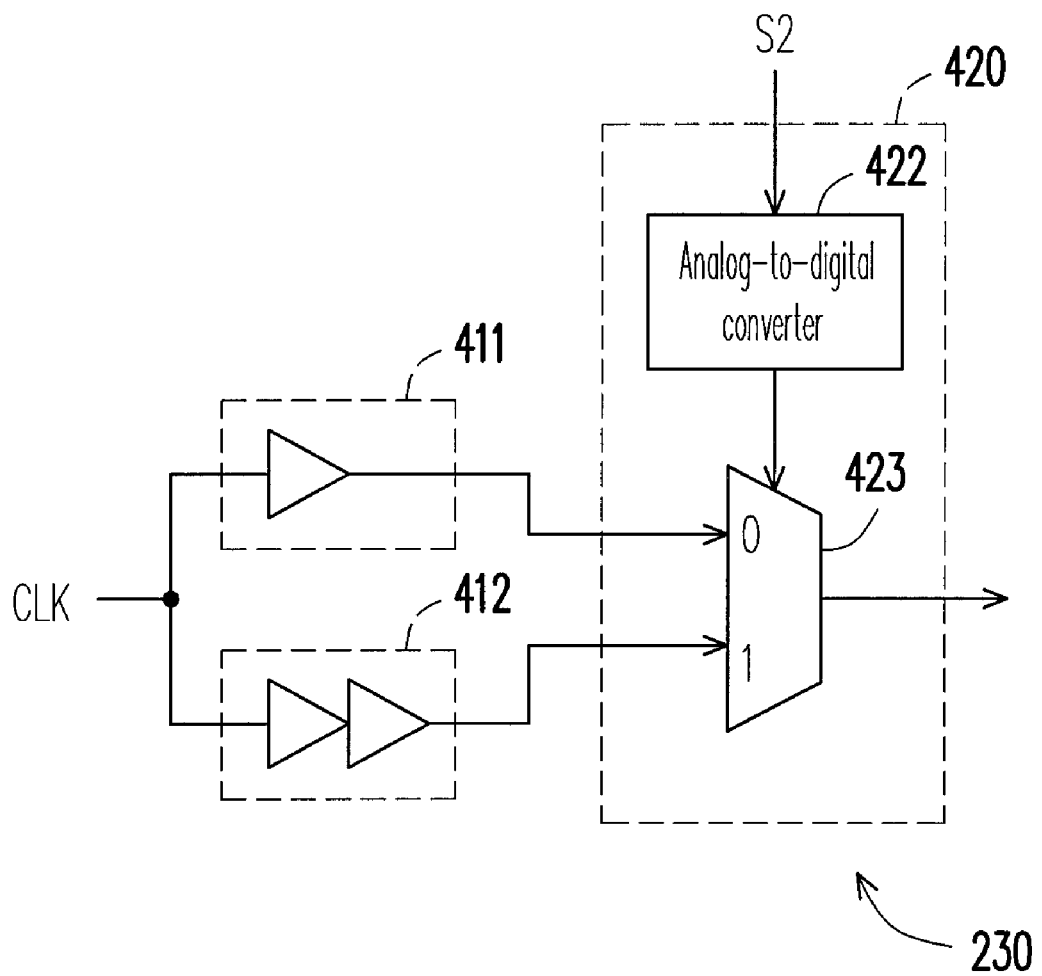
FIG. 6 illustrates another example of the PMA buffer in FIG. 4 according to an exemplary embodiment.

FIG. 6 illustrates another example of the PMA buffer in FIG. 4 according to an embodiment of the disclosure. It is also assumed herein that the IC has only two power modes and accordingly two delay channels 411 and 412 are disposed in the PMA buffer 230. In the present embodiment, the power information S2 supplies electricity to the operating voltage of the function module F2. Thus, the switch unit 420 is implemented by using an analog-to-digital converter (ADC) 422 and a multiplexer 423. The input terminal of the ADC 422 receives the power information (operating voltage) S2 and outputs a corresponding logic value to the multiplexer 423. The control terminal of the multiplexer 423 is coupled to the output terminal of the ADC 422. A plurality of input terminals of the multiplexer 423 is respectively coupled to the corresponding one of the delay channels 411 and 412, and the output terminal of the multiplexer 423 is electrically connected to the sub clock tree of the function module F2. If the power information S2 is a high voltage, the multiplexer 423 electrically connects the output terminal of the delay channel 412 to the sub clock tree of the function module F2. If the power information S2 is a low voltage, the multiplexer 423 electrically connects the output terminal of the delay channel 411 to the sub clock tree of the function module F2.

If a system having 9 different modules is taken as an implementation test vehicle and each module in the system can operate under the two operating voltages of 1.32V and 0.9V, the entire system has $2^9$ power modes. Under this condition, if the system clock signal CLK is transmitted to every module in the system through a conventional clock tree (without any PMA buffer), the clock skew may reach 495 ps in the worst case. If the system clock signal CLK is transmitted to every module in the system through the clock tree (with PMA buffers) described in foregoing embodiment, the clock skew in the worst case is reduced to 165 ps, about 66.8% less.

As described above, a PMA clock tree which does not affect the performance of the entire system is provided by embodiments of the disclosure, wherein the PMA buffers can generate a clock delay corresponding to different power mode. Thus, the new clock tree can satisfy the clock skew restrictions in different power modes, and a balance between the issues of clock skew and area cost is achieved. In some applications, the clock skew is reduced 66.8% by increasing only about 0.06% of the area cost through the technique described in foregoing embodiments.

It will be apparent to those skilled in the art that various modifications and variations can be made to the structure of the disclosure without departing from the scope or spirit of the invention. In view of the foregoing, it is intended that the disclosure cover modifications and variations of this disclosure provided they fall within the scope of the following claims and their equivalents.

What is claimed is:

1. A clock tree in an integrated circuit, comprising:
   at least two function modules, wherein each of the at least two function modules comprises a sub clock tree, wherein the sub clock tree transmits a delayed clock signal to different elements in each of the at least two function modules respectively;
   a system control circuit, coupled to the at least two function modules, providing at least two power information to the at least two function modules respectively, wherein a power mode of each of the at least two function modules is determined according to the power information respectively; and
   at least two power-mode-aware (PMA) buffers, each of the at least two PMA buffers coupled to the sub clock tree in each of the at least two function modules and the system control circuit, for determining a delay time of a system clock signal according to the power information respectively, delaying the system clock signal, and outputting respectively the delayed system clock signal to the sub clock tree in each of the at least two function modules as the delayed clock signal.

2. The clock tree according to claim 1, wherein the power information is a power mode control signal, and the function module determines an operating voltage according to the power mode control signal.

3. The clock tree according to claim 1, wherein the power information is an operating voltage, and the operating voltage supplies operating electricity to the function module.

4. The clock tree according to claim 1, wherein the PMA buffer comprises:
- a plurality of delay channels, respectively having a different delay time, wherein input terminals of the delay channels receive the system clock signal; and
- a switch unit, coupled between the delay channels and the sub clock tree, for electrically connecting an output terminal of one of the delay channels to the sub clock tree according to the power information.

5. The clock tree according to claim 4, wherein the switch unit is a multiplexer.

6. The clock tree according to claim 4, wherein the switch unit comprises:
- an analog-to-digital converter (ADC), having an input terminal for receiving the power information; and
- a multiplexer, having a control terminal coupled to an output terminal of the ADC, a plurality of input terminal respectively coupled to the corresponding delay channels, and an output terminal electrically connected to the sub clock tree.

7. A synthesis method of a clock tree in an integrated circuit, wherein the clock tree comprises at least two function modules, comprising:
- configuring a sub clock tree in each of the at least two function modules, wherein the sub clock tree transmits a delayed clock signal to different elements in each of the at least two function modules respectively;
- disposing a system control circuit coupled to the at least two function modules, wherein the system control circuit provides at least two power information to the at least two function modules respectively, wherein a power mode of each of the at least two function modules is determined according to the power information respectively; and
- disposing at least two PMA buffers to supply the delayed clock signal to the sub clock tree in each of the at least two function modules, each of the at least two PMA buffers coupled to the sub clock tree in each of the at least two function modules and the system control circuit, wherein each of the at least two PMA buffers determines a delay time of a system clock signal according to the power information respectively, delays the system clock signal, and outputs respectively the delayed system clock signal to the sub clock tree as the delayed clock signal.

8. The synthesis method according to claim 7, wherein the power information is a power mode control signal, and the function module determines an operating voltage according to the power mode control signal.

9. The synthesis method according to claim 7, wherein the power information is an operating voltage, and the operating voltage supplies operating electricity to the function module.

10. The synthesis method according to claim 7 further comprising: when the power mode indicates that the function module operates under a first voltage, optimizing a clock delay of the clock tree to determine a first delay time corresponding to the first voltage in the PMA buffer.

* * * * *